United States Patent [19]
Epstein et al.

[11] Patent Number: 5,858,561
[45] Date of Patent: *Jan. 12, 1999

[54] BIPOLAR ELECTROLUMINESCENT DEVICE

[75] Inventors: Arthur J. Epstein, Bexley; Yunzhang Wang; Darren Douglas Gebler, both of Columbus, all of Ohio

[73] Assignee: The Ohio State University, Columbus, Ohio

[*] Notice: The term of this patent shall not extend beyond the expiration date of Pat. No. 5,663,573.

[21] Appl. No.: 396,465

[22] Filed: Mar. 2, 1995

[51] Int. Cl.$^6$ .................................................. H05B 33/00
[52] U.S. Cl. .................. 428/690; 428/411.1; 428/457; 428/917; 313/504; 313/509; 257/79
[58] Field of Search .............................. 428/411.1, 457, 428/461, 688, 689, 698, 699, 917, 690; 313/504, 509; 257/79

[56] References Cited

U.S. PATENT DOCUMENTS

| | | | |
|---|---|---|---|
| 4,613,793 | 9/1986 | Panicker et al. | 315/169.3 |
| 4,967,251 | 10/1990 | Tanaka et al. | 257/78 |
| 5,049,780 | 9/1991 | Dobrowolski et al. | 313/509 |
| 5,055,360 | 10/1991 | Ogura et al. | 428/473.5 |
| 5,079,334 | 1/1992 | Epstein et al. | 528/210 |
| 5,457,565 | 10/1995 | Namiki et al. | 359/273 |
| 5,504,323 | 4/1996 | Heeger et al. | 250/214.1 |
| 5,663,573 | 9/1997 | Epstein et al. | 257/40 |

OTHER PUBLICATIONS

Aratani, S., et al., "Improved Efficiency in Polymer Light–Emitting Diodes Using Air–Stable—Electrodes." *Journal of Electronic Materials*, vol. 22, No. 7 (Nov. 7, ), pp. 745–749.

Bradley, D.D.C., "Conjugated polymer electroluminescence." *Synthetic Metals*, vol. 54 (1993), pp. 401–415.

Burroughs, et al., "Light–emitting Diodes Based on Conjugated Polymers." *Nature*, vol. 347 (1990), pp. 539–541.

Byrne, H.J., "Nonlinear optical and Transport Properties in Fullerene Crystals and their Relationships to Crystal Structure." *Proceeding of the Electrochemical Society*, vol. 94 (1994), p. 603.

Fou, A.C. et al., "Interlayer Interactions in Self–Assembled Poly(Phenlyene Vinylene) Multilayer Heterostructures, Implications for Light–Emitting and Photorectifying Diodes." Presentation at Symposium U3.21 Solid State Ionics, Materials Research Society, Boston Meeting 1994. [Status of Publication Unknown].

Fou, A.C. et al., "Molecular Level Processing of Electroactive Polymers for Thin Film Devices." *ANTEC '95*, (1995), pp. 1594–1594.

Fou A.C. et al., "Self–Assembled Multilayers of Electroactive Polymers: From Highly Conducting Transparent Thin Films to Light Emitting Diodes." *Proceedings of the American Chemical Society Division of Polymeric Materials: Science and Engineering*, vol. 72 (Spring Meeting, 1995), pp. 160–161.

Greenham, N.C., et al., "Efficient light–emitting diodes based on polymers with high electron affinities." *Nature*, vol. 365 (Oct. 14, 1993), pp. 628–630.

(List continued on next page.)

*Primary Examiner*—Marie Yamnitzky
*Attorney, Agent, or Firm*—Kremblas,Foster,Millard & Pollick

[57] ABSTRACT

Light emitting bipolar devices consist of an electroluminescent organic light emitting material sandwiched between two layers of insulating material each of which is in contact with an electrode. The devices operate with AC voltage at voltages of less than twenty four volts and in some instances at less than five volts. Under AC driving, the device produces modulated light output that can be frequency or amplitude modulated. Under DC driving, the device operates in both forward and reverse bias.

47 Claims, 4 Drawing Sheets

OTHER PUBLICATIONS

Jeglinski, S.A., et al., "Electrically Symmetric Poly(Phenylene Acteylene) Diodes." *Mol. Cryst. Liq. Cryst.,* vol. 256 (1994), pp. 555–561.

Mach, R., "Thin Film Electroluminescence Devices." in: Kitai, A. H., *Solid State Luminescence* (London, Chapman & Hall 1993), pp. 229–263.

Osaheni, John A., et al., "Spectroscopic and Morphological Studies of Highly Conducting Ion–Implanted Rigid–Rod and Ladder Polymers." *Macromolecules,* vol. 25 (nov. 21, 1992), pp. 5828–5835.

Romero, D.B., "Effects of Doping in Polymer Light–Emitting Diodes." *Bulletin of the American Physical Society,* vol. 40 (Feb. 10, 1995), [Abstract submitted for Meeting of the American Physical Society, San Jose, CA, Mar. 1995].

BIPOLAR ELECTROLUMINESCENT DEVICE

BACKGROUND OF THE INVENTION

1. Field of the Invention

This invention relates to light-emitting devices driven by an electric field and which are commonly referred to as electroluminescent devices. In particular, this invention relates to electroluminescent devices having an organic electroluminescent material capable of being driven by either a positive or negative electric field, that is, the device is capable of being used with either a forward or reverse electrical current. Most particularly, the invention relates to an electroluminescent organic material device capable of being driven by an alternating electric field, that is, the electroluminescent organic material device is capable of being driven by the alternating voltages associated with an alternating current.

2. Background

Inorganic electroluminescence devices were discovered by Destriau in 1936. Destriau observed that when suitably prepared inorganic zinc sulfide phosphor powders activated with small additions of copper, were suspended in an insulator and an intense alternating electric field (15 kV) applied with capacitor-like electrodes, light emission resulted. Electroluminescent research gained further impetus with the advent of transparent conducting electrodes based on tin oxide ($SnO_2$) in the late 1940's. Typically early devices were composed of two sheets of electrically conductive material serving as electrodes, one a thin conducting backing and the other a transparent conductive film, placed on opposite sides of a plastic or ceramic sheet impregnated with an inorganic phosphor, such as zinc sulfide doped with small amounts of copper or manganese. A transparent glass sheet placed next to the transparent conductive sheet served as an outermost protective substrate. Application of an alternating voltage to the electrodes caused an electric field to be applied to the phosphor. Each time the field would change, radiation of the wavelength of visible light was emitted. Although a large amount of research and investigation was conducted on the alternating current electroluminescent devices, the devices never achieved practical application although they were originally highly touted as a room lighting source. Unfortunately, at high brightness levels, the AC electroluminescent devices exhibited a very short life and after about 1963, most of the research into the AC electroluminescence devices was severely curtailed. The most recent efforts in this area have been directed to a molecular carbon (fullerene-60) system. The high voltage drive requirements, the associated high cost of drive circuitry, poor stability, and lack of color tunability have made these devices cost prohibitive.

Two other inorganic devices, 1) direct current (DC) inorganic semiconductor light emitting diodes (LEDs) and 2) fluorescent ion doped inorganic semiconductor thin film devices, trace their origins to the mid-fifties. Light emitting diodes based on forward biased inorganic semiconductor p-n junctions are limited to small area applications as a result of color, efficiency, and cost limitations. The other inorganic devices, fluorescent, ion-doped, inorganic, semiconductor thin film devices, require high operating voltages to accelerate electrons or holes to sufficient energies in order to excite or ionize the fluorescent ion centers. Such high operating voltages result in thin-film instability and failure of such devices.

In the last decade, there has been an emerging interest in direct current (DC) molecular and polymer electroluminescence devices. A variety of organic molecules and conjugated polymers, copolymers, and mixtures have been found to exhibit electroluminescent properties. Light-emitting diodes incorporating these materials have demonstrated all of the necessary colors (red, green and blue) needed for display applications. However, a need continues to exist to lower the device operating voltages and to increase their light-emitting (output) efficiency. Further improvements in charge injection and the balancing of charge transport are needed. Because of the asymmetry of the device configuration, efficient charge injection occurs only in one direction (forward DC bias). Under reverse bias, most of the devices either degrade quickly or show very poor performance. Although efforts have been made to improve the charge injection efficiency by the use of low work function electrodes such as calcium or magnesium and the use of an electron transporting material to improve negative charge (electron) injection, such devices continue to be operational only in one direction. Similarly, efforts have been made to improve charge injection efficiency by the use of high work function electrodes such as indium tin oxide (ITO) or gold and the use of hole transporting materials to improve positive charge (hole) injection. Such devices also continue to be operational in only one direction. A need continues to exist to develop bipolar devices that have low turn on and operating voltages, flexibility, large area, high operating (light output) efficiency and low production cost.

It is an object of the present invention to provide a low operating voltage electroluminescent device.

It is an object of the present invention to provide an alternating or reversible direct voltage drive electroluminescent device.

It is an object of the present invention to provide an electroluminescent device using electroluminescent organic materials including organic molecules and organic polymers.

It is an object of the present invention to provide a flexible electroluminescent device.

It is an object of the present invention to provide a large electroluminescent area device.

It is an object of the present invention to provide a device with a longer lifetime.

It is an object of the present invention to provide an electroluminescent device with high emissive light output.

It is an object of the present invention to provide frequency modulated light output.

It is an object of the present invention to provide amplitude modulated light output.

SUMMARY OF THE INVENTION

These objects have been met with the present invention of a bipolar electroluminescent organic material device. This device features an electroluminescent organic material sandwiched between a first electrically insulating material and a second insulating material. That is, the first insulating material and the second insulating material contact the electroluminescent material on opposite sides in sandwich fashion. The first insulating material is in electrical contact with a first electrode while the second insulating material is in electrical contact with a second electrode. The first electrode and the second are connected to a voltage source (potential difference) in either direction. That is, the first electrode can be connected to a positive potential (anode) while the second electrode is connected to a negative potential (cathode) or the connections can be reversed, with the first electrode connected to a negative potential while the second electrode is connected to a positive potential (opposite current direction). Since the device can be operated in either current direction with similar output efficiency, the device is referred to as a bipolar device. Such an arrangement of electroluminescent material, first and second insulating materials and first and second electrodes is of particular advantage in that it allows the device to be driven with an alternating voltage, that is, the device can and is preferably used with alternating current.

A wide variety of electroluminescent (light emitting) organic materials, insulating materials and electrodes are used in the device. Preferably these layers are formed and arranged as layers in a sandwich-type device. That is, the organic light emitter is at the center surrounded by two insulating layers which are in turn surrounded by electrode materials which are attached to a voltage source in either polarity and preferable to an alternating voltage associated with alternating current.

Electroluminescent organic materials include both molecular and polymer forms. These materials include light emitting polymeric polypridines such as poly(p-pyridines), copolymers such as poly(phenylenevinylene pyridylvinylene) and molecular light emitters such as 8-hydroxyquinoline. Insulating materials include a wide variety of ceramics such as aluminum oxide and inorganic and organic materials such as polysilane, polymethylmethacylate, nylon, emeraldine base (an insulating polyaniline polymer) and organic molecules such as 2-(4-biphenyl)-5-(4-tert-butylphenyl)-1,3,4 oxdiazole. Electrodes can be fashioned from any suitable conductor including, but not limited to, a wide variety of conducting materials including 1) indium tin-oxide, 2) metals such as gold, aluminum, calcium, silver, copper, indium, 3) alloys such as magnesium-silver, 4) conducting fibers such as carbon fibers, and 5) conducting organic polymers such as conducting doped polyaniline and conducting doped polypyrrole.

In typical applications where the device is used for lighting and display, at least one of the electrodes is fashioned from a transparent material such as indium tin oxide or a partially transparent material such as conducting doped polyaniline. The insulator between the light emitting material and the transparent or partially transparent electrode is also transparent or partially transparent and fabricated from an optically clear insulating polymer such as polymethylmethacylate or a partially transparent insulating polymer such as the insulating emeraldine base form of polyaniline. Partially transparent electrodes and insulators can be used to advantage to filter or clip unwanted portions (frequencies) of light coming from the organic light emitter.

For ease of manufacture and insulation purposes, it is preferable to form the device on a substrate which also serves to protect and typically insulate the device during use. Glass or clear insulating plastic are preferable when the device is used for lighting and display purposes. The AC driven symmetrical device is especially suitable for light emission from both sides of the device in which case both insulators and electrodes are at least partially transparent as well as any insulating substrates that may be used with one or both electrodes.

It is noted that it is not necessary for either of the electrodes or insulating materials to be transparent or even partially transparent. In cases where the insulators and electrodes are opaque to the emitter light, light emission from the edge of the device may be utilized in, for example, coupling applications such as coupling the device to an optical fiber. Since the device is AC driven, it has the advantage of delivering modulated light output in frequency modulated or amplitude modulated form.

The invention features a relatively low turn-on and operating AC or DC voltage of less than about 24 volts. More preferably a turn-on and operating voltage of less than about 12 and less than about 6 volts have been achieved. In some cases a turn-on and operating voltage of less than about 5 volts has been achieved. These low voltages make these devices particularly advantageous for use in toys, as commercial light strips such as found on airplanes and in theaters, as signs, and as flat panel displays for computer and television use.

The foregoing and other advantages of the invention will become apparent from the following disclosure in which one or more preferred embodiments of the invention are described in detail and illustrated in the accompanying drawings. It is contemplated that variations in procedures, processing, structural features, arrangement of parts, experimental design, ingredients, compositions, compounds, and elements may appear to a person skilled in the art without departing from the scope of or sacrificing any of the advantages of the invention.

Figure 1:
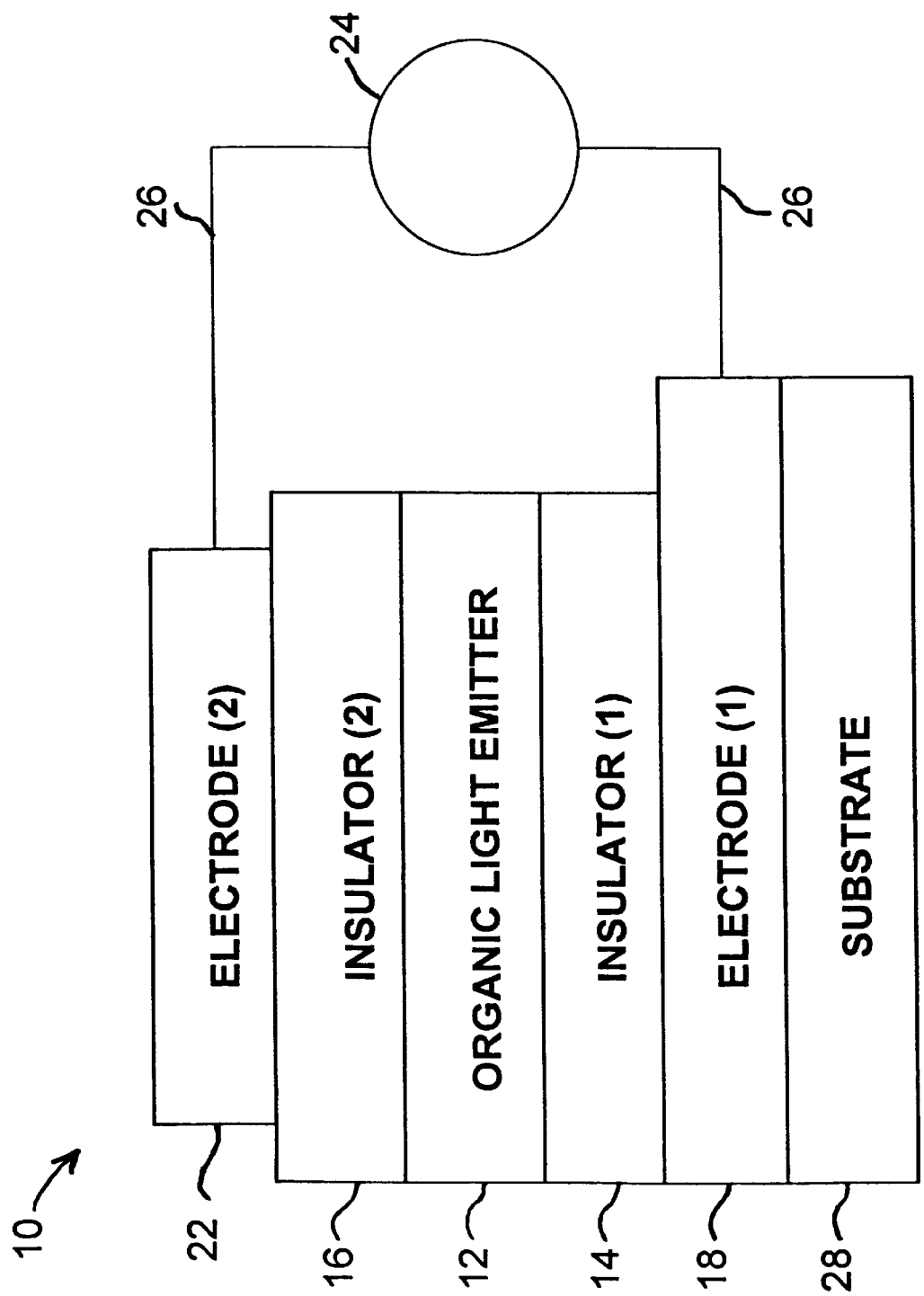
FIG. 1 is a schematic drawing of the bipolar device of the present invention.

In describing the preferred embodiment of the invention which is illustrated in the drawings, specific terminology is resorted to for the sake of clarity. However, it is not intended that the invention be limited to the specific terms so selected and it is to be understood that each specific term includes all technical equivalents that operate in a similar manner to accomplish a similar purpose.

Although a preferred embodiment of the invention has been herein described, it is understood that various changes and modifications in the illustrated and described structure can be affected without departure from the basic principles that underlie the invention. Changes and modifications of this type are therefore deemed to be circumscribed by the spirit and scope of the invention, except as the same may be necessarily modified by the appended claims or reasonable equivalents thereof.

DETAILED DESCRIPTION OF THE INVENTION AND BEST MODE FOR CARRYING OUT THE PREFERRED EMBODIMENT

As shown in FIG. 1, the current invention generally denoted by the number 10 consists of, in its basic form, an electroluminescent organic material, that is, organic light-emitter 12, a first electrical insulator 14 in contact with the organic light-emitter 12, a second electrical insulator 16 also in contact with organic light-emitter 12 and on the opposite side of the light-emitter 12 from the first insulator 14. A first electrode 18 is in electrical contact with the first insulator 14 and a second electrode 22 is in electrical contact with the second insulator 16. The first electrode 18 and the second electrode 22 are connected to a voltage source 24 by electrical connectors 26. Voltage source 24 can be a direct voltage source connected in either direction, that is, connected to produce a current that flows in either a forward or reverse direction. Preferably the voltage source 24 is an alternating voltage source producing an alternating current.

As used here, the term organic light-emitter material refers to any electroluminescent organic material that converts electric energy into electromagnetic radiation. Typically the wavelength of the output electromagnetic radiation (light) falls in the range from ultraviolet to near infrared, that is, from about 250 nanometers to about 2500 nanometers. Preferably the wavelength of the output radiation is in the range from about 300 to about 1200 nanometers.

The electroluminescent organic material (organic light emitter) can be chosen from a wide variety of organic light-emitting materials including both molecular and polymeric light emitting materials. The preparation and use of such materials is well known to those skilled in the art. As used here, the term polymeric material is used for materials having repeating structural units in the chemical structure such as, for example, H—$(C_6H_4)_n$—H (poly(phenylene)) whereas the term molecular material is used for materials having only one structural unit such as, for example, $C_9H_7NOH$ (8-hydroxyquinoline). Representative polymeric organic light emitting groups include groups such as, but not limited to, polypyridines, polypyridylvinylenes, polythiophenes, polyphenylenes, polyphenylenevinylenes, rigid-rod polymers such as the polyphenylenebenzobisthiazoles and polybenzimidazobenzophenanthrolines, polyfluorenes, polyvinylcarbazoles, polynaphthalenevinylenes, polythienylenevinylenes, polyphenyleneacetylenes, polyphenylenediacetylenes, and polycyanoterephthalylidenes. A wide variety of specific materials (derivatives) can be found in each of these groups as a result of modifications to the basic structure, typically as a result of substitution of electron donating and withdrawing groups according to techniques well-known to those skilled in synthetic organic chemistry. Electron-donating groups that can be substituted on the structures of the above light emitters can include, but are not limited to, —R, —OR—, halogens (electron donating by means of a resonance effect), —$NR_2$, —NHCOR, —OH, —O—, —SR, —OR, and —OCOR where R is an alkyl, aryl or arylalkyl group. Electron withdrawing groups can include halogens (electron withdrawing by way of an inductive effect), —$NO_2$, —COOH, —COOR, —COR, —CHO, and —CN. As with the electron donating groups, R is an alkyl, aryl or arylalkyl group. Nitrogen containing light emitting groups also include the quaternized form of the nitrogen atom. In addition, these materials can be copolymerized or mixed with other light-emitting polymers and molecules and non-light emitting polymers and molecules to give a wide variety of materials with a broad range of properties including a wide range of color outputs, light emission efficiencies, lifetimes, and mechanical properties such as flexibility and ease of fabrication. Illustrative specific polymeric derivatives from various light emitting polymeric groups include polypyridines (poly(p-pyridine)); polypyridylvinylenes (poly(p-pyridylvinylene)); polyphenylenes (poly(p-phenylene), polyphenylenevinylenes (poly(p-phenylenevinylene), poly(2,5-dimethoxy-p-phenylenevinylene), poly(2-methoxy-5-(2'ethylhexoxy)-p-phenylenevinylene), and poly(2,5-bis(cholestanoxy)-p-phenylenevinylene)); polyphenylenebenzobisthiazoles (poly (p-phenylenebenzobisthiazole)); polythiophenes (poly(3-alkyl)thiophene and especially poly(3-hexylthiophene)); polyfluorenes (poly(9-alkylfluorene)); polyvinylcarbazoles (poly(N-vinylcarbazole); and polynaphthalenevinylene (1,4-naphthalenevinylene). Representative electroluminescent light-emitting molecules include 8-hydroxyquinoline, naphthostyrylamine, perylene, anthracene, coronene, rhodamine B, and 12-phthaloperinene. As with the polymeric materials, these materials can also be mixed with other light emitting molecules and polymers or non-light emitting molecules and polymers to give a wide range of light-emitting materials.

As used here, the term electrically insulating material or alternatively, insulator or electrical insulator refers to a material that is a poor conductor of electricity. Typically the resistivity of the insulating material is greater than about $10^5$ ohm-cm. The preferred resistivity range is about $10^8$ to about $10^{13}$ ohm-cm. A wide variety of electrical insulating materials (insulator) can be used in the present invention including conventional ceramics, organic materials and inorganic polymers. Ceramic materials include, for example, glass, alumina, beryllia, porcelain, zirconia, carbides, nitrides, and silicon nitrides. Organic insulating materials include acrylonitrile-butadiene-styrenes, acetals, acrylics, chlorinated polyethers, polyvinylcarbazoles, fluorocarbons, nylons, parylenes (polyparaxylylenes), phenoxies, polyamide-imides, polyimides, polycarbonates, polyethylenes, polypropylenes, polyethylene terephthalates, polyphenylene oxides, polystyrenes, polysulfones, conjugated polymers, copolymers thereof and mixtures thereof. As used in this document, the term mixture also includes blends and dispersions. The conjugated polymers include materials such as the polythiophenes and the insulating forms of the polyanilines such as emeraldine base with an imine to amine ratio of about 0.4 to about 2.5 and various derivatives as more fully described in U.S. Pat. No. 5,079,334 all of which is herein incorporated by reference. Insulating organic molecules such as 2-(4-biphenyl)-5-(4-tert-butylphenyl)-1,3,4-oxadiazole may also be used as the insulating material. To facilitate the use of such insulating organic molecules they are often dispersed in a host polymer such as insulating emeraldine base or a polyvinylcarbazole. Inorganic polymers include both purely inorganic and inorganic-organic polymers such as siloxanes, phosphazenes, and silicones. These materials can be copolymerized or mixed with each other to give a wide variety of materials with a broad range of properties including insulating characteristics, flexibility or stiffness, and processability.

A wide variety of electrode materials can be used as the electrodes of the present device including 1) indium tin-oxide, 2) metals including calcium, aluminum, indium, gold, copper, silver, 3) alloys such as magnesium/silver, 4) conducting non-metals such as carbon and graphite fibers and filaments, and 5) conducting polymers such as polyaniline doped with dopants such as camphor sulfonic acid, hydrochloric acid, tosylic acid, and dodecylbenzene sulfonic acid and polypyrrole doped with phosphorous hexafluoride and p-toluenesulfonate. As used here a conducting polymer is a polymer with a conductivity of more than about $10^{-2}$ S/cm and preferably more than about $10^{-1}$ S/cm.

For many applications, it is desirable to use a transparent electrode such as indium tin-oxide and a transparent insulator such as polymethylmethacrylate. It is often preferable to fabricate the device using a suitable substrate 28. Typically the substrate is an insulating material such as a plastic or glass. Glass and optical plastics such as polymethylmethacrylates, polycarbonates, polystyrene, methylpentene, and various copolymers and mixtures may be used when light transmission is desired.

For ease of manufacture, a substrate 28 is used to fabricate the layered structure shown in FIG. 1. Although it is not necessary for the operation of device 10, it is convenient to use such a substrate in device fabrication. In addition, the substrate serves as a protective surface for the adjacent electrode. In addition, a second substrate (not shown) can be used in conjunction with the second electrode. The substrates are usually non-conducting materials with properties that depend greatly on the application of the device. Protective substrates may be opaque, transparent or partially transparent to the emitted light and made from a wide variety of ceramic organic, and organic materials. Very often it is preferable to have a transparent substrate especially when the device is used for lighting or as a display device. In such instances it is desirable to have an optically clear material. Many of the materials used as insulators 14 and 16 may also be utilized as a substrate material. A wide variety of materials are available with plastics being especially useful because of fabrication ease. Further details are available in many reference books such as *Engineered Materials Handbook,* Vol. 2, "Engineering Plastics" and especially the chapters on "Electrical Properties," p. 460 and "Optical Properties," p. 481.

Generally, the device shown in FIG. 1 is prepared using a spin casting technique. First, a commercially available glass substrate covered with indium tin-oxide is patterned by etching to form electrode 18. After etching, the indium tin-oxide electrode and substrate are cleaned ultrasonically in isopropyl alcohol, blown dry with nitrogen and irradiated in a UV-ozone chamber for approximately twenty minutes. A layer of an insulating material is then coated onto the electrode using a spin-casting technique. The technique involves dissolving the insulator material in a suitable solvent, placing a few drops on the electrode covered substrate and spinning the substrate using a commercially available spin-casting device. After drying the insulator material in a dynamic vacuum, a layer of the light emitter is then coated onto the insulator layer again using a spin-casting technique, in which, the light emitter material is dissolved in a suitable solvent, placed on the insulator material and spun in the spin-casting device. It is noted that care must be used in the selection of solvents so as to avoid dissolving the previously deposited material 14. After drying the organic light emitter layer 12, a solution of a second insulator is placed on the organic light emitter layer 12 and also spin cast. After drying, a suitable electrode 22 is deposited on the insulator layer using conventional vacuum evaporation techniques at approximately $10^{-6}$ torr. To avoid damage to the insulators and organic light emitter during the electrode deposition step, the device is mounted on a cooled surface during deposition of electrode 22. Typically, a water cooled surface is sufficient to prevent damage to the organic materials found in the device.

The spin casting technique is conventional and well-known in the art. A wide variety of other well known methods may also be used to obtain the layered structure shown in FIG. 1 including doctor blading, dip coating, chemical vapor deposition, physical vapor evaporation, sputtering, and Langmuir-Blodgett techniques. Spin casting is preferred due to the ease of fabrication and uniformity of the resulting thin films.

In fabricating the devices of this invention, the electrodes are of sufficient thickness to provide electrical continuity. The thickness of the insulating material ranges from about 0.5 nm to about 10,000 nm. For high resistance insulating materials such as $Al_2O_3$, it is preferred to have an insulating material thickness of about 1 to about 300 nm while for low resistance materials such as emeraldine base, a preferable thickness ranges from about 10 to about 10,000 nm. Generally the light emitting material has a thickness of about 10 to about 1000 nm with a thickness of about 20 nm to about 200 nm being preferred.

The electrodes 18 and 22 are connected to a voltage source 24 by means of suitable electrical connectors or contacts 26. These electrical connectors and contacts are conventional in the art and include wire leads, printed circuit connectors, spring clips, snaps, solder, wrapped posts, conducting glues, etc. It is also to be understood that the electrical connector or contact 26 can be the electrodes 18 and 22 themselves. That is, the potential difference 24 may be applied directly to the electrodes in which case electrodes 18 and 22 become the electrical contact or connector.

As noted previously, voltage source 24 may be either a direct current voltage source producing a direct current (DC) or an alternating voltage source producing an alternating current (AC). It has generally been found that the devices shown in FIG. 1 are capable of being driven in either a forward or reverse direction using a direct voltage source or with an alternating voltage source. In both instances the turn-on voltage has been found to be less than about 24 V, usually less than about 12 V, typically less than about 6V and even less than about 5 V. As such, the device finds wide application in a wide variety of semiconductor and low voltage applications.

EXAMPLE I

Indium Tin-Oxide/Emeraldine Base/Poly(p-pyridine)/Emeraldine Base/Aluminum Device An indium tin-oxide (ITO) coated glass substrate from Delta Technologies, Ltd., Stillwater, Minn., was etched using photolithographic techniques to produce a patterned first electrode. After etching was complete, the etched ITO glass was cleaned by sonication in isopropyl alcohol for 20–30 minutes. The etched ITO glass was blown dry with $N_2$ and then irradiated in a UV-Ozone chamber for 10 minutes.

A 0.5% solution of emeraldine base (EB) form of polyaniline in N-methylpyrrolidone (NMP) was prepared by mixing 0.5 milligrams of EB having an imine/amine ratio of about 1.1 in 1.0 milliliters of NMP. The resulting solution was sonicated and filtered if necessary. Emeraldine base was prepared by the method of MacDiarmid et al. disclosed in *Faraday Discussion Chemical Society,* 88, 317–332 (1989). A solution of poly(p-pyridine) (PPy) was made by adding 1 ml of formic acid to 10.5 mg of PPy powder. PPy was synthesized by a reductive metal mediated coupling polymerization as described by Yamamoto et al. in *Chemistry Letters,* 153–154 (1988).

These solutions were then used to spin coat thin films of EB and PPy onto the etched ITO glass. Several drops (3–5) of the EB/NMP solution were placed on the etched ITO glass substrate and the substrate was spun at 2000 rpm for 15 seconds using a Photo Resist Spinner (EC101DT) made by Headway Research, Inc. Garland, Tex. The resulting insulator film was dried in a dynamic vacuum at $10^{-3}$ torr. After drying, 3–5 drops of the PPy formic acid solution were placed on the EB film coated ITO glass substrate and the substrate was spun at 2000 rpm for 15 seconds to afford a layer of organic light-emitter electroluminescent material. A second film of EB insulating material similar to the first, was spun on top of the electroluminescent PPy film. The final ITO/EB/PPy/EB substrate was again dried under dynamic vacuum at $10^{-3}$ torr. Aluminum (Al) was then evaporated onto the second EB insulator layer to form a second electrode using conventional vacuum vapor deposition methods at pressures below about $4 \times 10^{-6}$ torr. Thin copper wires were attached to the ITO electrode and the Al electrode using a silver paste (Du Pont Conductor Composition #5007 made by the Du Pont Company of Wilmington, Del.). The paste was allowed to dry for about 12–24 hours.

The current-voltage characteristics of the device were measured using two Keithley 195A multimeters. One was set to record voltage and the other was set to record current. The output of the Keithley multimeters was recorded with an IBM compatible 486DX-66 MHz computer via a National Instruments (Austin, Tex.) general purpose interface bus (GPIB) card. The same procedure was used to test in reverse bias except that the ground and positive wires were switched at the power supply. The voltage was varied from 0 to 20 volts in the forward bias hookup and from 0 to –20 volts in the reverse bias hookup. The light produced by the device appeared whitish blue to the human eye and became visible at +4 volts in forward bias hookup and at –4 volts in reverse hookup.

Figure 2:
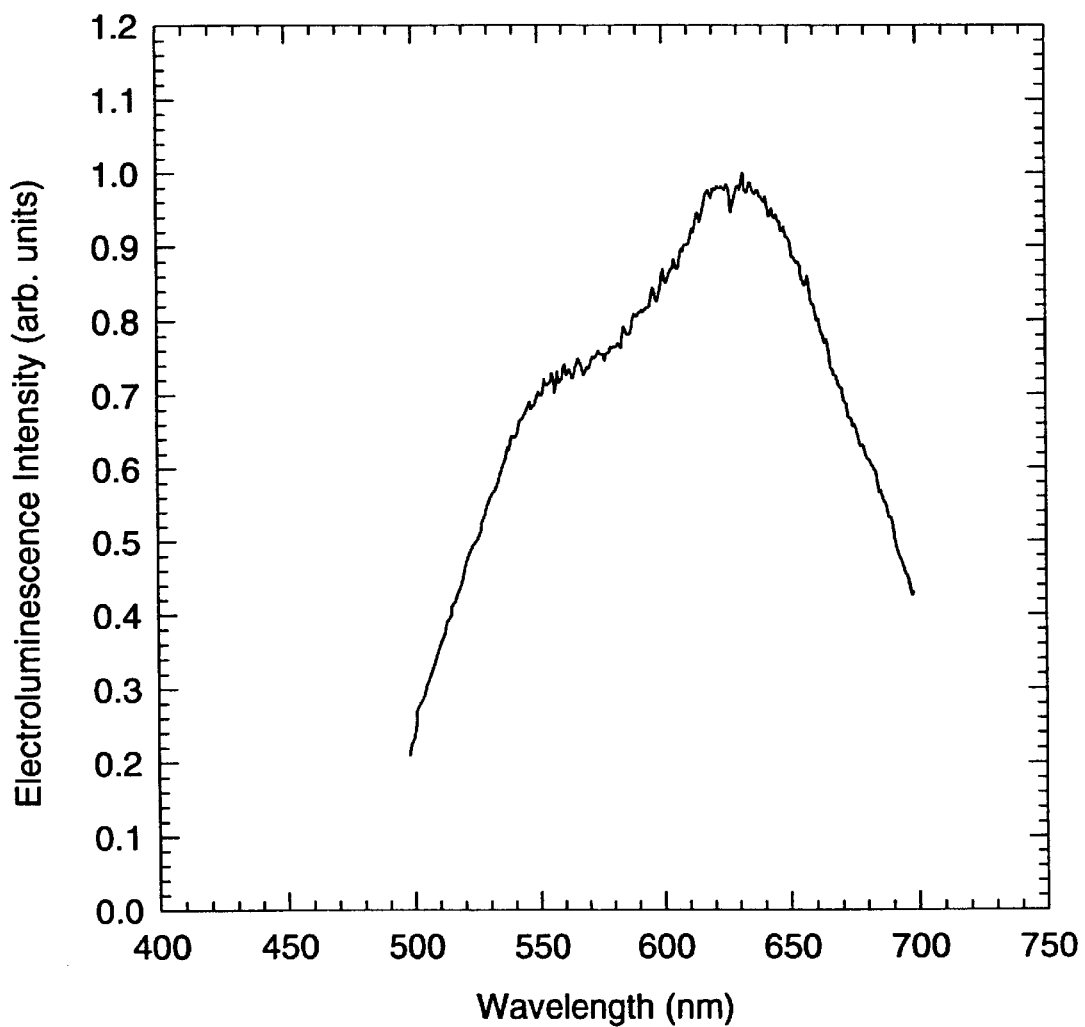
FIG. 2 is the electroluminescence spectrum of an indium tin oxide/emeraldine base/poly(p-pyridine)/emeraldine base/aluminum device showing wavelength in nanometers on the horizontal axis and electroluminescence intensity in arbitrary units (a.u.) on the vertical axis.

The electroluminescent spectrum was measured using a Model HR640 spectrograph (Instruments S. A., Longjumeau, France) and a charged coupled device (CCD; Model 200E; Photometrics Ltd. Tucson, Ariz.) and recorded using a GPIB equipped computer. A maximum intensity peak was observed at about 630 nm. A second less intense peak was noted at about 540 nm. The spectrum is shown in FIG. 2.

Figure 3:
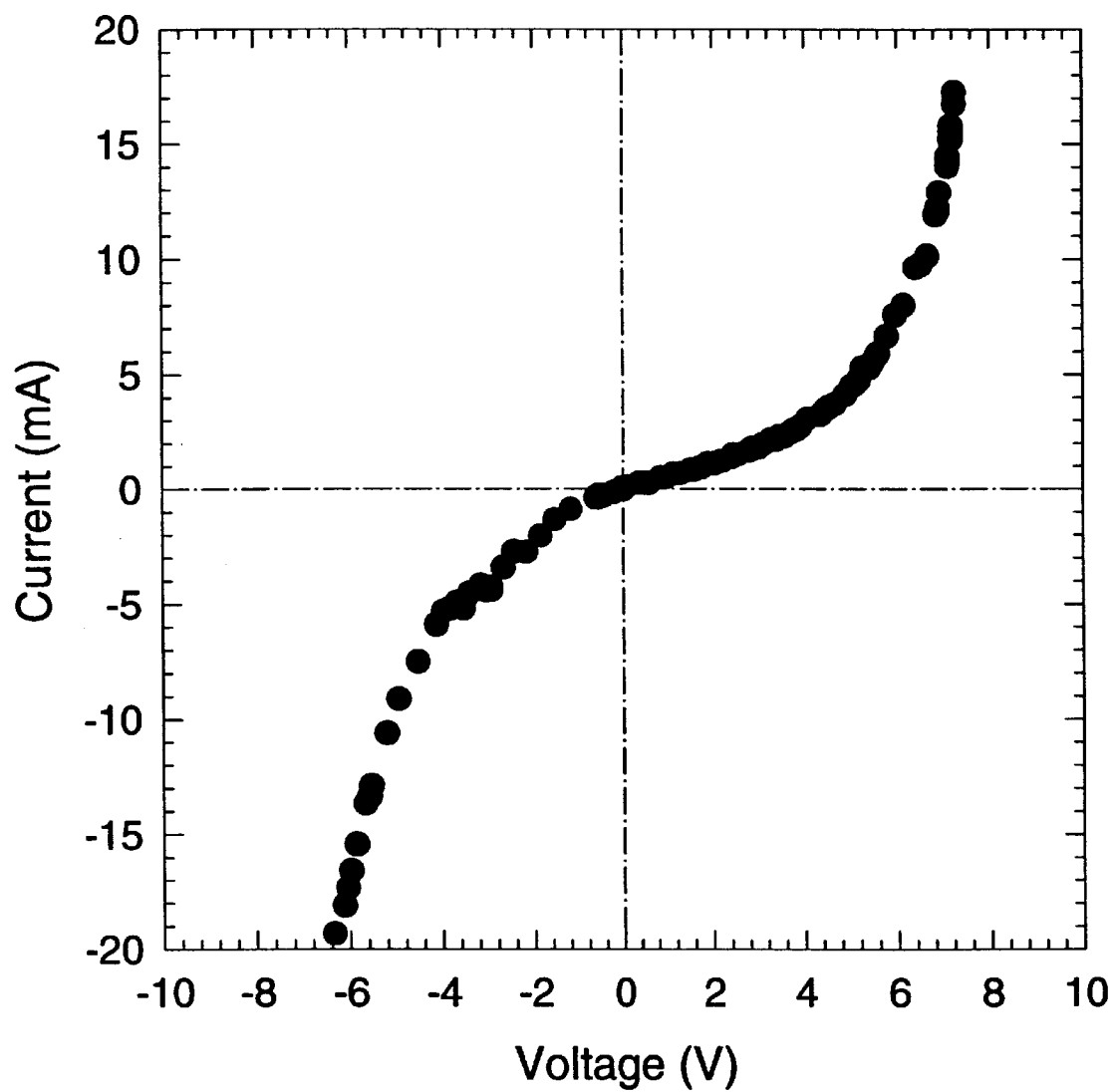
FIG. 3 is a current voltage (I-V) curve for an indium tin oxide/emeraldine base/poly(p-pyridine)/emeraldine base/aluminum device showing voltage on the horizontal axis in volts (V) and current on the vertical axis in milliamperes (mA).

FIG. 3 shows the current versus voltage characteristics of a typical ITO/EB/PPy/EB/Al device. The turn-on voltage for the particular device tested was +4 volts in forward bias and –4 volts in reverse bias. The symmetry of the current-voltage (I-V) curve shows that the device worked equally well under forward and reverse DC bias in spite of the fact that the electrodes have different work functions.

The device was also tested in AC mode using a Hewlett Packard Model HP3311A Function Generator (Houston, Tex.). The light output was observed at double the frequency of the function generator. The light was measured using a photomultiplier (PMT) (type R928, Hamamatsu Photonics K.K., Shimukanzo, Japan) driven by a high voltage power supply (PS350 made by Stanford Research System, Palo Alto, Calif.) and an oscilloscope (Model 2430A made by Tektronix, Inc., Beaverton, Oreg.). The voltage was simultaneously measured with the same oscilloscope. The data was recorded using a GPIB card-equipped computer.

Figure 4:
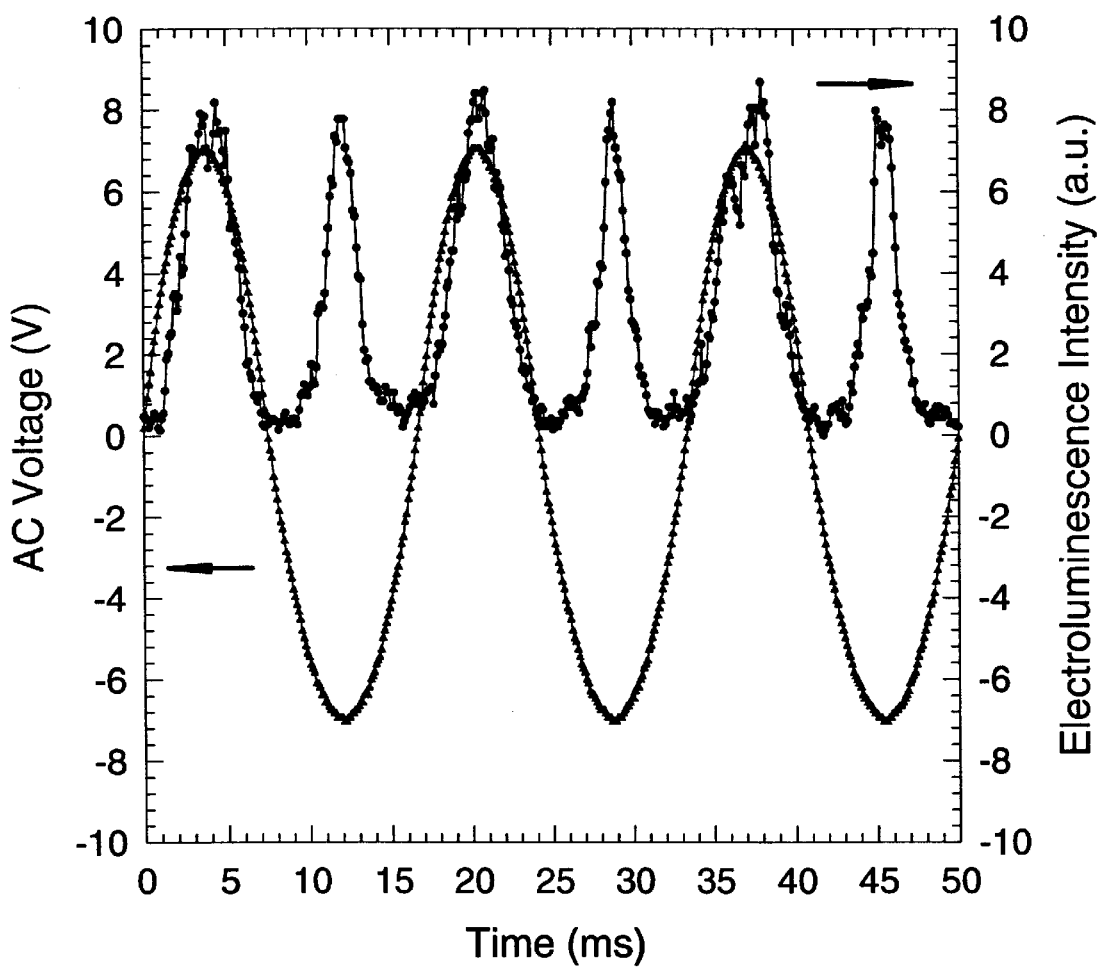
FIG. 4 is a plot showing light intensity and AC voltage as a function of time for an indium tin oxide/emeraldine base/poly(p-pyridine)/emeraldine base/aluminum device. AC voltage in volts (V) is shown on the left vertical axis, light intensity in arbitrary units (a.u.) is shown on the right vertical axis, and time in milliseconds (ms) is shown on the horizontal axis.

FIG. 4 shows the light intensity and AC voltage as a function of time. The AC voltage varies from about +7 to about –7 volts with a frequency of 60 Hz. The intensity of the light peaks at both +7 and –7 volts are of equal intensity again demonstrating a significant lack of dependance of light intensity on the work function of the electrodes. The device was found to operate in a frequency range from about 1 Hz to about 100 kHz. The light output was reduced considerably above 100 kHz.

EXAMPLE II

Indium Tin-Oxide/Emeraldine Base/Poly(p-pyridylvinylene)/Emeraldine Base/Aluminum Device The method of Example I was followed except that the PPy solution was replaced by a solution of poly(p-pyridylvinylene) (PPyV). The PPyV solution was prepared by adding 1 ml of formic acid to 20 mg of PPyV. PPyV was prepared according to the method of Marsilla et al., *Polymer Preprints* 33(1), 1196 (1993). The resulting solution was sonicated to ensure the material dissolution.

The device was tested in a fashion similar to that used for Example I. The DC turn-on voltages were as low as +5 volts for forward bias and –5 volts for reverse bias. The AC operating voltages were also ±5 volts. The device operated in a frequency range of about 1 Hz to about 10 kHz. The device emitted an orange light visible to the human eye. AC and DC turn-on voltages are given in Table I.

EXAMPLE III

Indium Tin-Oxide/Emeraldine Base/Poly(p-pyridylvinylene)/Emeraldine Base/Gold Device The device was prepared according to the method of Example I except that the aluminum (Al) electrode was replaced by a gold (Au) electrode. Operating characteristics were similar to those for Example I except that turn-on voltages were higher. The DC turn-on voltage was ±10 volts (for forward and reverse bias) while the AC voltages were also at ±10 volts. Operating frequencies and light output were similar to those of Example I.

EXAMPLE IV

Indium Tin-Oxide/Emeraldine Base/Poly(D-pyridylvinylene)/Emeraldine Base/Gold Device The device was prepared according to the method of Example II except that the aluminum electrode was replaced by a gold (Au) electrode. Operating test results were similar to Example II except that the DC turn-on voltage was observed at ±11 volts (forward and reverse bias) and the AC voltages were also at ±11 volts. The operating frequencies and light output were similar to those of Example II.

EXAMPLE V

Indium Tin-Oxide/Polymethylmethacylate/Poly(p-pyridine/Polymethylmethacrylate/Aluminum Device The solution of EB in Example 1 was replaced by a solution of polymethylmethacrylate (PMMA). The solution was made by adding 1 ml of chloroform ($CH_3Cl$) to 0.5 mg of PMMA. The PMMA was purchased from the Aldrich Company (Millwaukee, Wis.). Light output and operating frequencies were similar to those of Example I. The DC and AC turn-on voltages were at ±15 volts.

EXAMPLE VI

Indium Tin-Oxide/Emeraldine Base and 2-(4-biphenyl)-5-(4-tert-butylphenyl) oxadiazole/Poly(p-pyridine)/Emeraldine Base and 2-(4-tert-butylphenyl)oxadiazole Aluminum Device The solution of Emeraldine Base (EB) prepared according to the method of Example 1 was replaced by a solution made from a mixture of EB and 2-(4-biphenyl)-5-(4-tert-butylphenyl)-1,3,4-oxadiazole (PBD). First a solution of 0.1% EB in N-methylpyrrolidone (NMP) was made by mixing 1 mg of EB powder in 1 ml of NMP. Next a solution of 5% PBD was made by mixing 50 mg PBD in 1 ml of NMP. The final solution of EB and PBD was made by mixing 50 drops of the EB solution with 2 drops of PBD solution. The PBD was purchased from the Aldrich Company (Milwaukee, Wis.). Light output and operating frequencies were similar to those of Example I. The DC and AC turn-on voltages were at ±12 volts.

EXAMPLE VII

Indium Tin Oxide/Polymethylmethacrylate/Poly(p-pyridine)/Emeraldine Base/Aluminum Device The method of Example 1 was followed except that one of the symmetrical layers of emeraldine base (EB) insulators was replaced with a layer of polymethylmethacrylate (PMMA) to form a structure in which two quite different insulating materials were used. The PMMA solution was made by adding 2 ml of chloroform to 50 mg of commercially available PMMA powder (Aldrich Co; see Example V). The light output and operating frequencies (AC mode) were similar to those of Example 1. The DC turn-on voltages were as low as +8 volts for a forward bias and −8 volts for reverse bias. AC operating voltages were also ±8 volts. Surprisingly and as with asymmetrical electrodes, the operational characteristics of the device are symmetrical and do not appear to depend on the nature of the insulator materials as apparent from the symmetrical operation of the device using dissimilar insulator materials.

TABLE I

Sample Direct Current (DC) and Alternating Current (AC) Turn-On Voltages

| Example | DC Turn-On Voltage | AC Turn-On Voltage |
|---------|--------------------|--------------------|
| I | ±4 to ±14 V | ±7 V |
| II | ±5 to ±14 V | ±5 V |
| III | ±10 V | ±10 V |
| IV | ±11 V | ±11 V |
| V | ±15 V | ±15 V |
| VI | ±12 to ±15 V | ±12 V |
| VII | ±8 V | ±8 V |

It is possible that changes in configurations to other than those shown could be used but that which is shown if preferred and typical. Without departing from the spirit of this invention, various means of fastening the components together may be used.

It is therefore understood that although the present invention has been specifically disclosed with the preferred embodiment and examples, modifications to the design concerning sizing and shape will be apparent to those skilled in the art and such modifications and variations are considered to be equivalent to and within the scope of the disclosed invention and the appended claims.

It is to be understood that although the present invention has been specifically disclosed with the preferred embodiment and examples, modifications to the experimental design may be apparent to those skilled in the art and such modifications and variations are considered to be within the scope of the invention and the appended claims. It is also intended that all matter contained in the above description shall be interpreted as illustrative and not in a limiting sense, the scope of the invention being indicated by the appended claims rather than by the foregoing description, and all changes that come within the meaning and range of equivalency of the claims are therefore intended to be embraced therein. That is, the following claims are intended to cover all of the generic and specific features of the invention herein described, and all statements of the scope of the invention which, as a matter of language, fall therebetween. Furthermore, it is to be understood that in the following claims, ingredients or compounds recited in the singular are intended to include compatible mixtures of such ingredients wherever the sense permits.

We claim:

1. A bipolar electroluminescent device comprising:
   a) an electroluminescent organic light-emitting material;
   b) a first electrically insulating material contacting said electroluminescent organic light-emitting material;
   c) a second electrically insulating material contacting said electroluminescent organic light-emitting material;
   d) said electroluminescent organic light-emitting material, said first electrically insulating material and said second electrically insulating material positioned and of a thickness to emit light in both a forward and a reverse current direction;
   e) a first electrode in electrical contact with said first electrically insulating material;
   f) a second electrode in electrical contact with said second electrically insulating material, and
   g) connection means for electrically connecting said first electrode and said second electrode to a voltage source.

2. The bipolar electroluminescent device according to claim 1 wherein said voltage source is an alternating voltage source.

3. The bipolar electroluminescent device according to claim 1 wherein at least one of said first electrically insulating material and said second insulating material is selected from the group of insulating materials consisting of ceramic insulating materials, organic insulating materials, and inorganic polymer insulating materials.

4. The bipolar electroluminescent device according to claim 3 with at least one of said first electrically insulating material and said second insulating material being an organic insulating material.

5. The bipolar electroluminescent device according to claim 4 wherein said organic insulating material is selected from the group of organic insulating materials consisting of conjugated polymers, acrylic polymers, nylon polymers, polyvinylcarbazoles, conjugated copolymers, acrylic copolymers, nylon copolymers, polyvinylcarbazole copolymers, organic insulating molecules, and mixtures thereof.

6. The bipolar electroluminescent device according to claim 5 with said organic insulating material being a conjugated polymer.

7. The bipolar electroluminescent device according to claim 6 with said conjugated polymer being a polyaniline polymer.

8. The bipolar electroluminescent device according to claim 7 with said polyaniline polymer being a polyaniline emeraldine base.

9. The bipolar electroluminescent device according to claim 5 with said organic insulating material being an organic insulating molecule.

10. The bipolar electroluminescent device according to claim 9 with said organic insulating molecule dispersed in a host polymer.

11. The bipolar electroluminescent device according to claim 10 with said organic insulating molecule being 2-(4-biphenyl)-5-(4-tert-butylphenyl)-1,3,4-oxadiazole.

12. The bipolar electroluminescent device according to claim 10 with said host polymer being emeraldine base.

13. The bipolar electroluminescent device according to claim 11 with said host polymer being emeraldine base.

14. The bipolar electroluminescent device according to claim 10 with said host polymer being polyvinylcarbazole.

15. The bipolar electroluminescent device according to claim 11 with said host polymer being polyvinylcarbazole.

16. The bipolar electroluminescent device according to claim 5 with said organic insulating material being an acrylic polymer.

17. The bipolar electroluminescent device according to claim 16 with said acrylic polymer being polymethylmethacrylate.

18. The bipolar electroluminescent device according to claim 3 with said insulating material being a ceramic insulating material.

19. The bipolar electroluminescent device according to claim 18, with said ceramic insulating material being aluminum oxide.

20. The bipolar electroluminescent device according to claim 1 wherein at least one of the first electrically insulating material and said second electrically insulating material is at least partially transparent.

21. The bipolar electroluminescent device according to claim 1 wherein said electroluminescent organic light-emitting material is selected from the group of organic light-emitting materials consisting of electroluminescent organic light-emitting molecules and electroluminescent organic light-emitting polymers.

22. The bipolar electroluminescent device according to claim 21 with said electroluminescent organic light-emitting material being an electroluminescent organic light-emitting polymer.

23. The bipolar electroluminescent device according to claim 22 wherein said electroluminescent organic light-emitting polymer is a polymer selected from the group of electroluminescent polymers consisting of polypyridines, polypyridylvinylenes, polyphenylenes, polyphenylenevinylenes, polythiophenes, polyvinylcarbazoles, polyfluorenes, polynaphthalenevinylenes, polyphenyleneacetylenes, polyphenylenediacetylenes, polycyanoterephthalylidenes, polyphenylenebenzobisthiazoles, polybenzimidazobenzophenanthrolines, polypyridine copolymers, polypyridylvinylene copolymers, polyphenylene copolymers, polyphenylenevinylene copolymers, polythiophene copolymers, polyvinylcarbazole copolymers, polyfluorene copolymers, polynaphthalenevinylene copolymers, polyphenyleneacetylene copolymers, polyphenylenediacetylene copolymers, polycyanoterephthalylidene copolymers, polyphenylenebenzobisthiazole copolymers, polybenzimidazobenzophenanthroline copolymers, and mixtures thereof.

24. The bipolar electroluminescent device according to claim 23 with said electroluminescent polymer being a polypyridine.

25. The bipolar electroluminescent device according to claim 24 with said polypyridine being poly(p-pyridine).

26. The bipolar electroluminescent device according to claim 23 with said electroluminescent organic polymer being a copolymer.

27. The bipolar electroluminescent device according to claim 26 wherein said electroluminescent copolymer is poly(phenylenevinylene pyridylvinylene).

28. The bipolar electroluminescent device according to claim 23 with said electroluminescent organic polymer being an electroluminescent polyphenylene.

29. The bipolar electroluminescent device according to claim 23 with said electroluminescent organic polymer being an electroluminescent polyphenylenevinylene.

30. The bipolar electroluminescent device according to claim 29 with said electroluminescent polyphenylenevinylene being poly(p-phenylenevinylene).

31. The bipolar electroluminescent device according to claim 23 with said electroluminescent organic polymer being an electroluminescent polyphenylenebenzobisthiazole.

32. The bipolar electroluminescent device according to claim 1 with at least one of said first electrode and said second electrode being an electrode material that is at least partially transparent.

33. The bipolar electroluminescent device according to claim 1 with at least one of said first electrode and said second electrode being an electrode material selected from the group of electrode materials consisting of In—$SnO_2$, metals, alloys, conducting non-metals, and conducting organic polymers.

34. The bipolar electroluminescent device according to claim 33 with said electrode material being In—$SnO_2$.

35. The bipolar electroluminescent device according to claim 1 further comprising a substrate in contact with one of said first electrode and said second electrode.

36. The bipolar electroluminescent device according to claim 35 wherein said substrate is at least partially transparent.

37. The bipolar electroluminescent device according to claim 35 with said substrate being electrically non-conducting.

38. The bipolar electroluminescent device according to claim 35 wherein said substrate is selected from the group of substrates consisting of glass and plastic.

39. The bipolar electroluminescent device according to claim 38 with said substrate being glass.

40. The bipolar electroluminescent device according to claim 39 with said electrode contacting said substrate being In—$SnO_2$.

41. The bipolar electroluminescent device according to claim 1 having a turn-on voltage of less than about 24 volts.

42. The bipolar electroluminescent device according to claim 1 having a turn-on voltage of less than about 12 volts.

43. The bipolar electroluminescent device according to claim 1 having a turn-on voltage of less than about 6 volts.

44. The bipolar electroluminescent device according to claim 1 having modulated light output.

45. The bipolar electroluminescent device according to claim 44 having frequency modulated light output.

46. The bipolar electroluminescent device according to claim 44 having amplitude modulated light output.

47. The bipolar electroluminescent device according to claim 1 wherein said first electrode and said second electrode are said connection means for electrically connecting said first electrode and said second electrode to said voltage source.

* * * * *

UNITED STATES PATENT AND TRADEMARK OFFICE
CERTIFICATE OF CORRECTION

PATENT NO. : 5,858,561
DATED : January 12, 1999
INVENTOR(S) : Epstein et al

It is certified that error appears in the above-identified patent and that said Letters Patent is hereby corrected as shown below:

Column 10, line 55, after "(4-tert-butylphenyl)" insert -- -1,3,4,- --.

Column 10, line 57, after "(4-tert-butylphenyl)" insert -- 1,3,4,- --.

Column 13, line 13, after "claim" delete the numberal "18." and insert therefor -- 18 --.

Signed and Sealed this

Twenty-seventh Day of July, 1999

Attest:

Q. TODD DICKINSON

Attesting Officer

Acting Commissioner of Patents and Trademarks